(12) United States Patent
Lee

(10) Patent No.: US 10,776,027 B2
(45) Date of Patent: Sep. 15, 2020

(54) STORAGE DEVICE AND METHOD OF OPERATING THE SAME

(71) Applicant: SK hynix Inc., Gyeonggi-do (KR)

(72) Inventor: Ji Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 70 days.

(21) Appl. No.: 16/119,477

(22) Filed: Aug. 31, 2018

(65) Prior Publication Data

US 2019/0187902 A1 Jun. 20, 2019

(30) Foreign Application Priority Data

Dec. 18, 2017 (KR) .................. 10-2017-0174480

(51) Int. Cl.

| | | |
|---|---|---|
| *G11C 29/00* | (2006.01) | |
| *G06F 3/06* | (2006.01) | |
| *G06F 11/10* | (2006.01) | |
| *G11C 29/52* | (2006.01) | |
| *G06F 12/10* | (2016.01) | |
| *G11C 29/24* | (2006.01) | |
| *G11C 11/56* | (2006.01) | |

(52) U.S. Cl.
CPC ............ *G06F 3/064* (2013.01); *G06F 3/0604* (2013.01); *G06F 3/0644* (2013.01); *G06F 3/0653* (2013.01); *G06F 3/0659* (2013.01); *G06F 3/0673* (2013.01); *G06F 11/1048* (2013.01); *G06F 11/1068* (2013.01); *G06F 12/10* (2013.01); *G11C 29/24* (2013.01); *G11C 29/52* (2013.01); *G06F 2212/1044* (2013.01); *G11C 11/5621* (2013.01); *G11C 11/5671* (2013.01); *G11C 2211/5641* (2013.01)

(58) Field of Classification Search
CPC ...... G06F 3/064; G06F 3/0604; G06F 3/0653; G06F 3/0673; G06F 11/1068; G06F 11/1048; G11C 29/52; G11C 29/24; G11C 11/5621; G11C 11/5671
See application file for complete search history.

(56) References Cited

U.S. PATENT DOCUMENTS

| | | | |
|---|---|---|---|
| 2003/0135793 A1* | 7/2003 | Craig ................... | G11C 16/349 714/42 |
| 2013/0132653 A1* | 5/2013 | Post ...................... | G06F 3/0644 711/103 |
| 2014/0006898 A1* | 1/2014 | Sharon ................ | H03M 13/356 714/755 |
| 2015/0067239 A1* | 3/2015 | Chu ..................... | G06F 12/0246 711/103 |

FOREIGN PATENT DOCUMENTS

| | | |
|---|---|---|
| KR | 1020160097657 | 8/2016 |
| KR | 1020170042433 | 4/2017 |

* cited by examiner

*Primary Examiner* — Samir W Rizk
(74) *Attorney, Agent, or Firm* — IP & T Group LLP

(57) ABSTRACT

Provided herein may be a storage device and a method of operating the same. The storage device for additionally securing an over-provisioning area may include at least one memory device, each including first memory blocks and second memory blocks, and a memory controller configured to store system data, stored in the first memory blocks of the at least one memory device, in the second memory blocks when a size of a residual space in a memory area of the at least one memory device is less than a threshold.

20 Claims, 13 Drawing Sheets

STORAGE DEVICE AND METHOD OF OPERATING THE SAME

CROSS-REFERENCE TO RELATED APPLICATION

The present application claims priority under 35 U.S.C. § 119(a) to Korean patent application number 10-2017-0174480, filed on Dec. 18, 2017, the disclosure of which is herein incorporated by reference in its entirety.

BACKGROUND

1. Field of Invention

Various embodiments of the present disclosure generally relate to an electronic device. Particularly, the embodiments relate to a storage device and a method of operating the storage device.

2. Description of Related Art

A storage device stores data under the control of a host device, such as a computer, a smartphone, or a tablet. The storage device may include a memory device in which data is stored and a memory controller which controls the memory device. Memory devices are mainly classified into a volatile memory device and a nonvolatile memory device.

In a volatile memory device, data stored therein is lost when power supply is interrupted. Examples of the volatile memory device include a static Random Access Memory (SRAM), a dynamic RAM (DRAM), and a synchronous DRAM (SDRAM).

In a nonvolatile memory device, data stored therein is retained even when power supply is interrupted. Examples of the nonvolatile memory device include a Read Only Memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM).

SUMMARY

Various embodiments of the present disclosure are directed to a memory controller that controls a memory device so that an over-provisioning area is additionally secured, a storage device having the memory controller, and a method of operating the memory controller.

An embodiment of the present disclosure may provide for a storage device. The storage device may include at least one memory device, each including first memory blocks and second memory blocks, and a memory controller configured to store system data, stored in the first memory blocks of the at least one memory device, in the second memory blocks when a size of a residual space in a memory area of the at least one memory device is less than a threshold.

An embodiment of the present disclosure may provide for a memory controller for controlling a plurality of memory devices, each including first memory blocks and second memory blocks. The memory controller may include a storage space monitor configured to compare a size of a residual space in a memory area of each of the plurality of memory devices with a threshold, and a system area setting unit configured to store system data, stored in the first memory blocks, in the second memory blocks when the size of the residual space is less than the threshold.

An embodiment of the present disclosure may provide for a method of operating a memory controller, the memory controller controlling a plurality of memory devices, each including first memory blocks and second memory blocks. The method may include determining whether a size of a residual space in a memory area of each of the plurality of memory devices is less than a threshold, and storing system data, stored in the first memory blocks, in the second memory blocks when the size of the residual space is less than the threshold.

DETAILED DESCRIPTION

Figure 1:
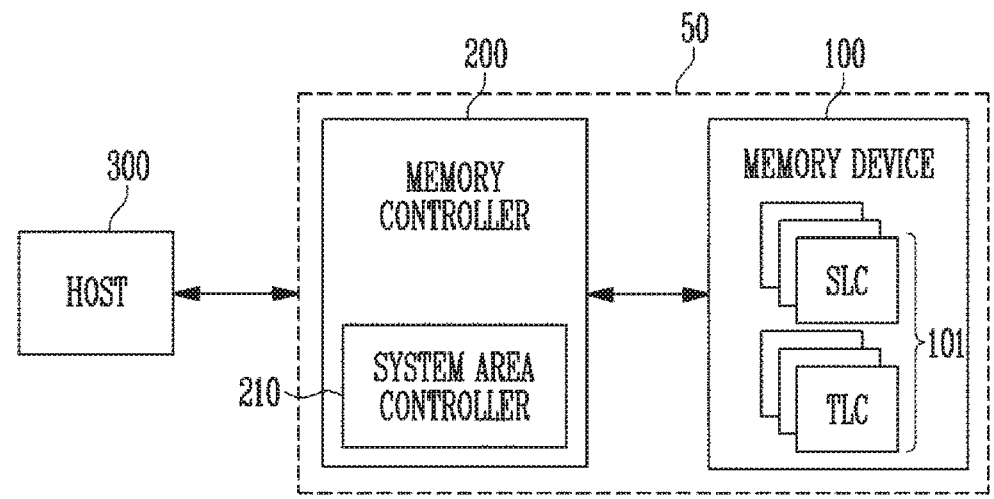
FIG. 1 is a diagram illustrating a storage device according to an embodiment of the present disclosure.

Example embodiments will now be described more fully with reference to the accompanying drawings; however, aspects of the invention may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations of shapes of structures in the illustrations as a result, for example, of manufacturing techniques and/or tolerances, are to be expected. Thus, embodiments should not be construed as limited to the particular shapes or regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless stated or the context indicates otherwise. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a storage device 50 according to an embodiment of the present disclosure.

Referring FIG. 1, the storage device 50 may include a memory device 100 and a memory controller 200.

The memory device 100 may store data. The memory device 100 is operated in response to the control of the memory controller 200. The memory device 100 may include a memory area 101 including a plurality of memory cells which store data. The memory area 101 may include a plurality of memory blocks. Each of the plurality of memory cells included in each of the memory blocks may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

Therefore, the memory area 101 may include a plurality of SLC blocks and TLC blocks according to the number of bits of data stored in memory cells which store data. Although FIG. 1 illustrates the memory area 101 including only SLC blocks and TLC blocks, the present embodiment is not limited thereto. That is, the memory area 101 may also include SLC blocks and MLC blocks or include SLC blocks and QLC blocks in embodiments of the present disclosure. However, hereinafter, a description will be made on the assumption that the memory area 101 includes SLC blocks and TLC blocks, for convenience of description.

An SLC block may include a plurality of pages implemented by SLC memory cells configured such that one bit of data is stored in a single memory cell, and may have high data computation performance and high durability and reliability. Further, a TLC block may include a plurality of pages implemented by TLC memory cells configured such that three bits of data are stored in a single memory cell, and may have a data storage space larger than that of the SLC block.

In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a Resistive RAM (RRAM), a Phase-change memory (PRAM), a Magnetoresistive RAM (MRAM), a Ferroelectric RAM (FRAM), or a spin transfer torque RAM (STT-RAM).

The memory device 100 may receive a command and an address from the memory controller 200, and access a region, selected in response to the address, in the memory area 101. That is, the memory device 100 may perform an operation corresponding to the command on the region selected in response to the address. For example, the memory device 100 may perform a program operation, a read operation, and an erase operation. During a program operation, the memory device 100 may program data in the region selected in response to the address. During a read operation, the memory device 100 may read data from the region selected in response to the address. During an erase operation, the memory device 100 may erase data stored in the region selected in response to the address.

In an embodiment, the program operation and the read operation may be performed on a page basis, and the erase operation may be performed on a block basis.

In an embodiment, the memory controller 200 may simultaneously control a plurality of memory devices rather than a single memory device 100. When the memory controller 200 controls a plurality of memory devices, the memory area 101 included in each of the memory devices may include SLC blocks and TLC blocks.

The memory controller 200 may control the overall operation of the memory device 100. The memory controller 200 may control the operation of the memory device 100 in response to a request received from a host 300 or regardless of the request received from the host 300.

For example, the memory controller 200 may control the memory device 100 so that a program operation, a read operation, or an erase operation is performed in response to the request received from the host 300. During a program operation, the memory controller 200 may provide a program command, an address, and data to the memory device 100. During a read operation, the memory controller 200 may provide a read command and an address to the memory device 100. During an erase operation, the memory controller 200 may provide an erase command and an address to the memory device 100.

In an embodiment, the memory controller 200 may autonomously generate a program command, an address, and data without receiving a request from the host, and transmit them to the memory device 100. For example, the memory controller 200 may provide commands, addresses, and data to the memory device 100 to perform background operations, such as a program operation for wear leveling and a program operation for garbage collection.

The memory controller 200 may run firmware (FW) for controlling the memory device 100. When the memory device 100 is a flash memory device, the memory controller 200 may operate firmware such as a Flash Translation Layer (FTL) for controlling communication between the host 300 and the memory device 100. More specifically, the memory controller 200 may translate a logical address included in a request received from the host 300 into a physical address which is an address ADD to be provided to the memory device 100.

The memory area 101 of the storage device 50 may be divided into a main data area and a system data area according to the type of stored data. The system data area may be subdivided into a system area in which system data is stored and an over-provisioning area required to maintain the operation performance of the storage device 50.

The system data stored in the system area may be map data related to mapping information between logical addresses and physical addresses, boot information related to information required for a boot operation of the storage device 50, setting information used for the operation of firmware (FW) of the memory controller 200, or the like.

The over-provisioning area may be a reserved area allocated to operate various functions required to drive the storage device 50 smoothly, such as wear-leveling, garbage collection, and bad block management. Therefore, the securement of space for the over-provisioning area influences the performance maintenance and lifespan extension of the storage device.

The memory controller 200 according to an embodiment of the present disclosure may further include a system area controller 210.

The system area controller 210 may control the operation of additionally allocating the size of the over-provisioning area depending on the size of a residual storage space included in the memory area 101. In detail, the system area controller 210 may secure available memory space from the system area by moving the system data, stored in the system area, from SLC blocks to TLC blocks when the size of the residual storage space included in the memory area 101 is decreased to a threshold or less, and may allocate the secured available memory space to the over-provisioning area.

In an embodiment, the system area controller 210 may move system data stored in the SLC blocks into the TLC blocks in units of system chunks in the plurality of memory devices 100 according to a Redundant Array of Independent Disks (RAID) storage scheme. The system area controller 210 may distribute the system data to the plurality of memory devices 100. Further, the system area controller 210 may generate parity system data using the system chunks to be distributed. The parity system data may be generated by performing an exclusive OR (XOR) operation on the system chunks to be distributed. The system area controller 210 may store the generated parity system data in any one of the plurality of memory devices. The memory device which stores the parity system data is referred to as a "parity memory chip" or a "parity memory device".

When it is impossible to access a system chunk stored in the TLC block of a specific memory device among pieces of system data distributed to the plurality of memory devices, the memory controller 200 may recover the system chunk failed to be accessed using the system chunks stored in the remaining memory devices and parity system data stored in the parity memory chip.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
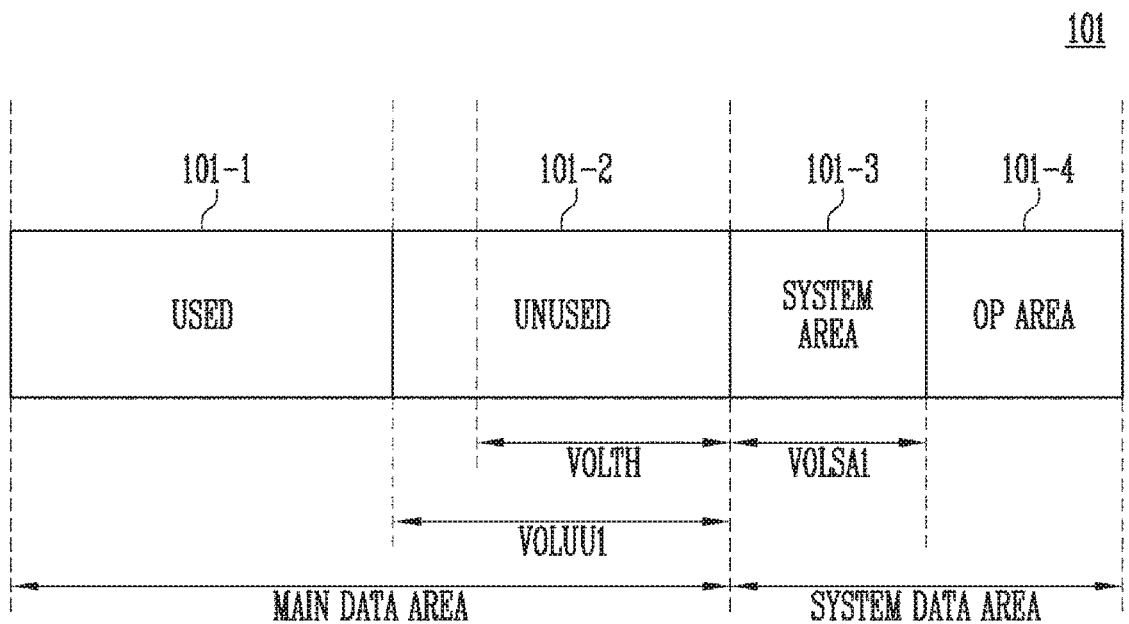
FIG. 2 is a diagram illustrating a memory area of the storage device of FIG. 1.

FIG. 2 is a diagram illustrating the memory area 101 of the storage device 50 of FIG. 1.

Referring to FIG. 2, the memory area 101 may be divided into a main data area and a system data area according to the type of stored data.

In the main data area, pieces of data requested by a host to be written may be stored. In FIG. 2, the main data area may be subdivided into a used space 101-1 in which data is already stored, and a residual space 101-2 in which data is not yet stored.

The system data area may be subdivided into a system area 101-3 in which system data is stored, and an over-provisioning area 101-4 which is required to maintain the operation performance of the storage device.

The system data stored in the system area 101-3 may be map data related to mapping information between logical addresses and physical addresses, boot information related to information required for a boot operation of the storage device, setting information used for the operation of firmware (FW) of the memory controller, or the like.

The over-provisioning area 101-4 may be a reserved area allocated to operate various functions required to drive the storage device 50 smoothly, such as wear-leveling, garbage collection, and bad block management. Therefore, the securement of space for the over-provisioning area influences the performance maintenance and lifespan extension of the storage device.

In FIG. 2, the size VOLUU1 of the residual space 101-2 is exemplified as greater than a threshold VOLTH. FIG. 2 exemplifies that the over-provisioning area 101-4 is determined as sufficiently secured since the size VOLUU1 of the residual space 101-2 is greater than a threshold VOLTH. In an embodiment, when the size of the residual space 101-2 of the main data area becomes smaller than the threshold VOLTH, the size of the over-provisioning space 101-4 may become greater by securing available memory space from the system area 101-3103 3 and allocating the secured available memory space to the over-provisioning space 101-4.

Figure 3:
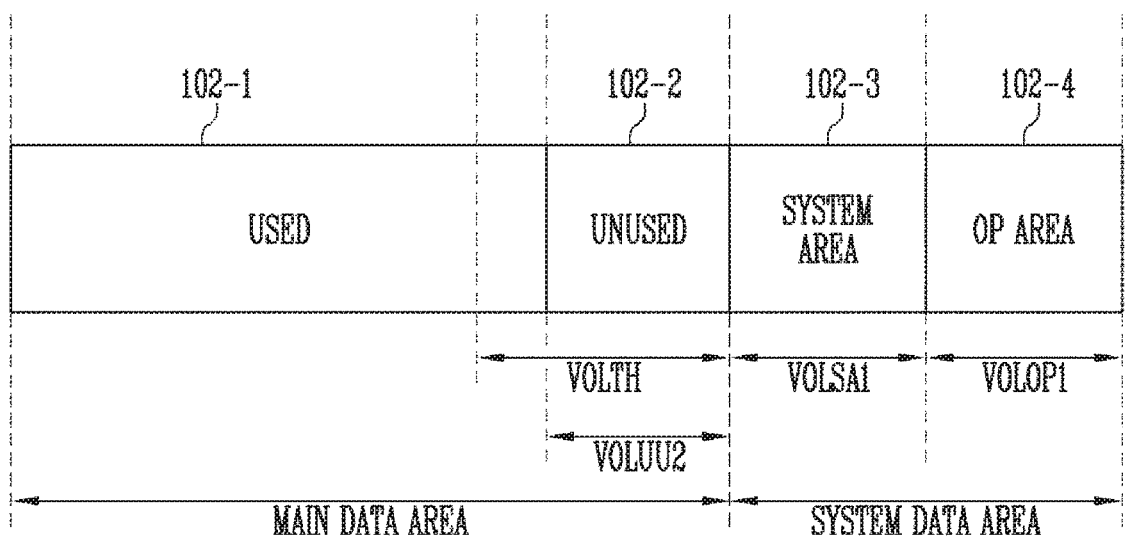
FIG. 3 is a diagram illustrating a case where the size of a residual storage space in the memory area of FIG. 2 is decreased to a threshold or less.

FIG. 3 is a diagram illustrating a case where the size of a residual storage space in the memory area of FIG. 2 is decreased to a threshold or less.

Referring to FIG. 3, since the size of the used space 102-1 of the main data area in the memory area 102 has increased compared to the memory area 101 of FIG. 2, the size VOLUU2 of the residual space 102-2 is decreased below the size VOLUU1 of the residual space 101-2 of FIG. 2. In FIG.

3, when the size VOLUU2 of the residual space 102-2 is less than the threshold VOLTH, the size of the over-provisioning space 102-4 required to maintain the performance of the storage device needs to become greater.

Figure 4:
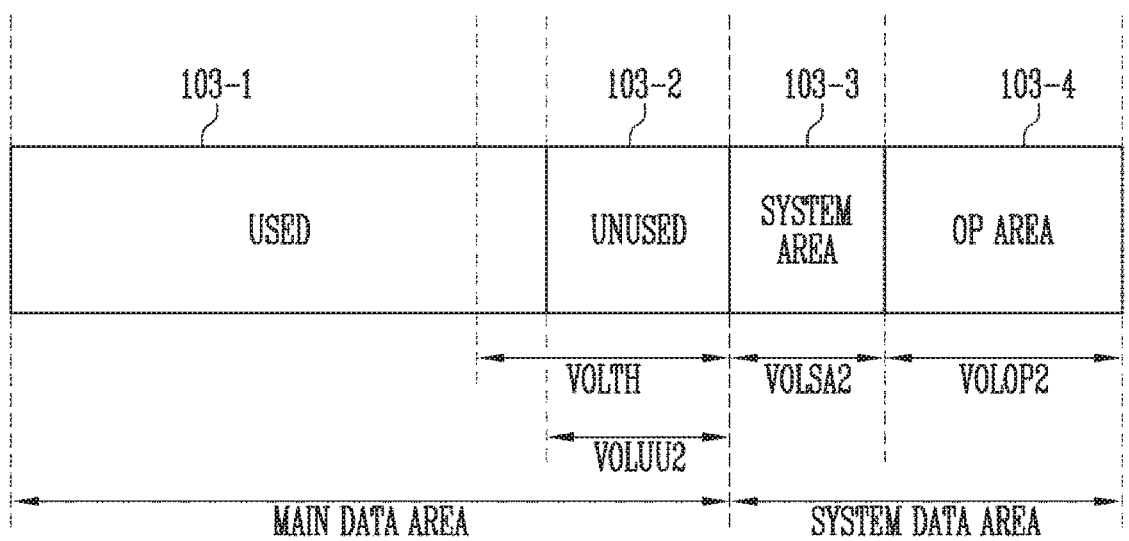
FIG. 4 is a diagram illustrating a memory area in a case where an over-provisioning area is additionally secured.

FIG. 4 is a diagram illustrating the memory area in a case where an over-provisioning area is additionally secured.

When system data stored in the system area 103-3 is moved from an SLC block to a TLC block, the storage capacity of the system area 103-3 may be decreased while securing available memory space as much as the decreased storage capacity. In accordance with an embodiment of the present disclosure, the memory controller 200 may secure available memory space from the system area 103-3 by moving the system data from the SLC block to the TLC block, and may allocate the secured available memory space of the system area 103-3 to the over-provisioning area 103-4 when the size VOLUU2 of the residual space 102-2 becomes smaller than a threshold VOLTH, as illustrated in FIG. 3.

In FIG. 4, the memory area 103 may be in a state in which the size VOLSA2 of the system area 103-3 is decreased below the size VOLSA1 of the system area 102-3 of FIG. 3 and the size of the over-provisioning area 103-4 is increased as much as the decreased size of the system area 103-3. The size VOLOP2 of the over-provisioning area 103-4 of FIG. 4 is increased above the size VOLOP1 of the over-provisioning area 102-4 of FIG. 3.

Therefore, even if the size VOLUU2 of the residual space 103-2 is smaller than the threshold VOLTH, the size VOLOP2 of the over-provisioning area 103-4 has increased compared to that of the memory area 102 of FIG. 3, and thus the over-provisioning area 103-4 required to maintain the performance of the storage device may be sufficiently secured.

Figure 5:
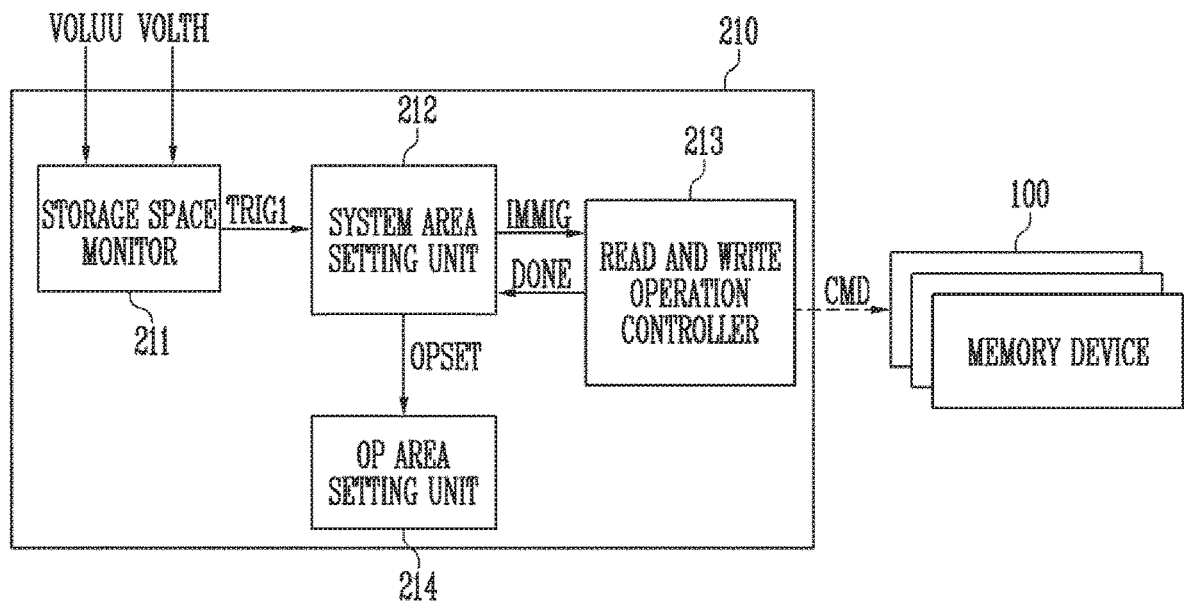
FIG. 5 is a block diagram illustrating the structure of a system area controller of FIG. 1.

FIG. 5 is a block diagram illustrating the structure of the system area controller 210 of FIG. 1.

Referring to FIG. 5, the system area controller 210 may include a storage space monitor 211, a system area setting unit 212, a read and write operation controller 213, and an over-provisioning (OP) area setting unit 214. Although the read and write operation controller 213 is illustrated as being included in the system area controller 210 in FIG. 5, the read and write operation controller 213 may be included in an element other than the system area controller 210 in various embodiments of the memory controller 200.

The storage space monitor 211 may receive residual space information VOLUU, indicating the current size of the residual space 101-2, and the threshold VOLTH. The residual space information VOLUU may be received from firmware (FW) run by a memory controller 200, or may be received from a memory block management unit (not illustrated) which is included in the memory controller 200 and manages memory blocks of the memory device 100. Alternatively, in various embodiments, the residual space information VOLUU may be directly received from the memory devices 100. Further, the threshold VOLTH may be stored in advance in the memory controller 200 or in the storage space monitor 211. In an embodiment, the threshold VOLTH may be changed in response to a request from an external host.

The storage space monitor 211 may compare the residual space information VOLUU with the threshold VOLTH, and may output a triggering signal TRIG1 to the system area setting unit 212 if the residual space information VOLUU is less than the threshold VOLTH.

The system area setting unit 212 may set the size of the system area 101-3 in each of the memory areas 101 included in the memory devices 100. The system area setting unit 212 may control the operation of moving the system data from SLC blocks to TLC blocks in each memory device 100.

When the triggering signal TRIG1 is received from the storage space monitor 211, the system area setting unit 212 may provide to the read and write operation controller 213 various types of control signals IMMIG for moving the system data from the SLC blocks to the TLC blocks in the memory devices 100.

The read and write operation controller 213 may provide the memory devices 100 with a read command for reading the system data from the SLC blocks and a write command for storing the read system data in the TLC blocks in the memory devices 100 under the control of the system area setting unit 212.

In an embodiment, the system area setting unit 212 may control the read and write operation controller 213 so that system data is read from the SLC blocks and is then distributed and programmed into the TLC blocks in units of system chunks in the memory devices 100. Here, the system area setting unit 212 may generate parity system data using the system chunks to be distributed. The parity system data may be generated by performing an exclusive OR (XOR) operation on the system chunks to be distributed. The system area setting unit 212 may control the read and write operation controller 213 so that the generated parity system data is stored in any one of the plurality of memory devices 100. The memory device which stores the parity system data may be a parity memory chip or a parity memory device.

As a result of moving the system data from the SLC blocks to the TLC blocks by distributing the system data to the plurality of memory devices 100, available memory space may be secured from the system area 101-3 and thus it is now ready to allocate the secured available memory space to the over-provisioning area 101-4.

When the system data is moved in the TLC blocks of the memory devices 100, the system area setting unit 212 may output to the OP area setting unit 214 an OP area setting signal OPSET for allocating the secured available memory space to the over-provisioning area 101-4. The OP area setting unit 214 may adjust the size of the over-provisioning area 101-4 in response to the OP area setting signal OPSET.

Figure 6:
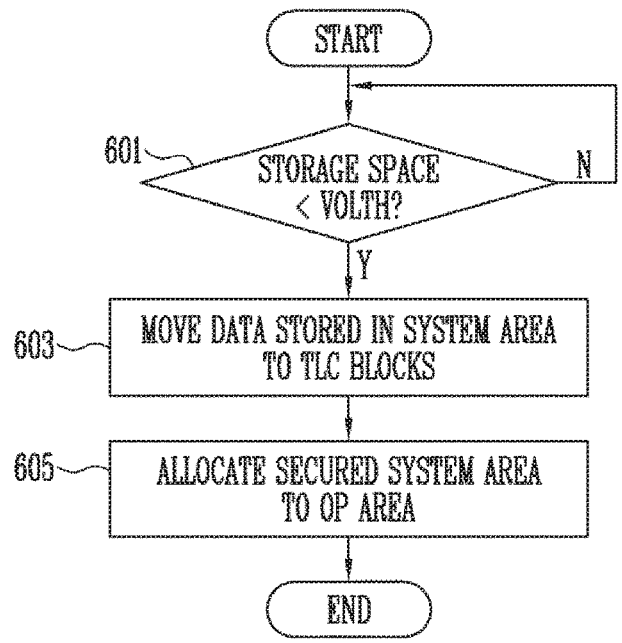
FIG. 6 is a flowchart describing a method of operating a memory controller according to an embodiment of the present disclosure.

FIG. 6 is a flowchart illustrating a method of operating a memory controller 200 according to an embodiment of the present disclosure.

Referring to FIG. 6, at step 601, the memory controller 200 may determine whether the size of the residual space 101-2 of the main data area in the memory devices 100 is less than the threshold VOLTH. In an embodiment, when the size of the residual space 101-2 of the main data area becomes smaller than the threshold VOLTH, the size of the over-provisioning space 101-4 may become greater by securing available memory space from the system area 103-3 and allocating the secured available memory space to the over-provisioning space 101-4.

Step 601 may be performed whenever a data write operation is completed. In an embodiment, step 601 may be periodically performed whenever a preset time has elapsed. In an embodiment, step 601 may be performed at a preset point in time. In an embodiment, step 601 may be performed whenever an erase operation is completed.

If it is determined at step 601 that the size of the residual space 101-2 is less than the threshold VOLTH, the memory controller 200 proceeds to step 603.

At step 603, the memory controller 200 may move the system data stored in the SLC blocks of the system area 101-3 to TLC blocks. For example, the memory controller 200 may read the system data, stored in the SLC blocks, temporarily store the system data, and then store the system data in the TLC blocks.

In an embodiment, the system area controller 210 may move the system data stored in the SLC blocks into the TLC blocks in units of system chunks in the plurality of memory devices 100 according to the RAID storage scheme. The system area controller 210 may distribute the system data to the plurality of memory devices 100. Further, the system area controller 210 may generate the parity system data using the system chunks to be distributed. The parity system data may be generated by performing an exclusive OR (XOR) operation on the system chunks to be distributed. The system area controller 210 may store the generated parity system data in the parity memory chip or the parity memory device among the plurality of memory devices 100.

As a result of moving the system data from the SLC blocks to the TLC blocks by distributing the system data to the plurality of memory devices 100, available memory space may be secured from the system area 101-3 and thus it is now ready to allocate the secured available memory space to the over-provisioning area 101-4.

At step 605, the memory controller 200 may allocate available memory space secured from the system area 101-3 to the over-provisioning area 101-4.

Figure 7:
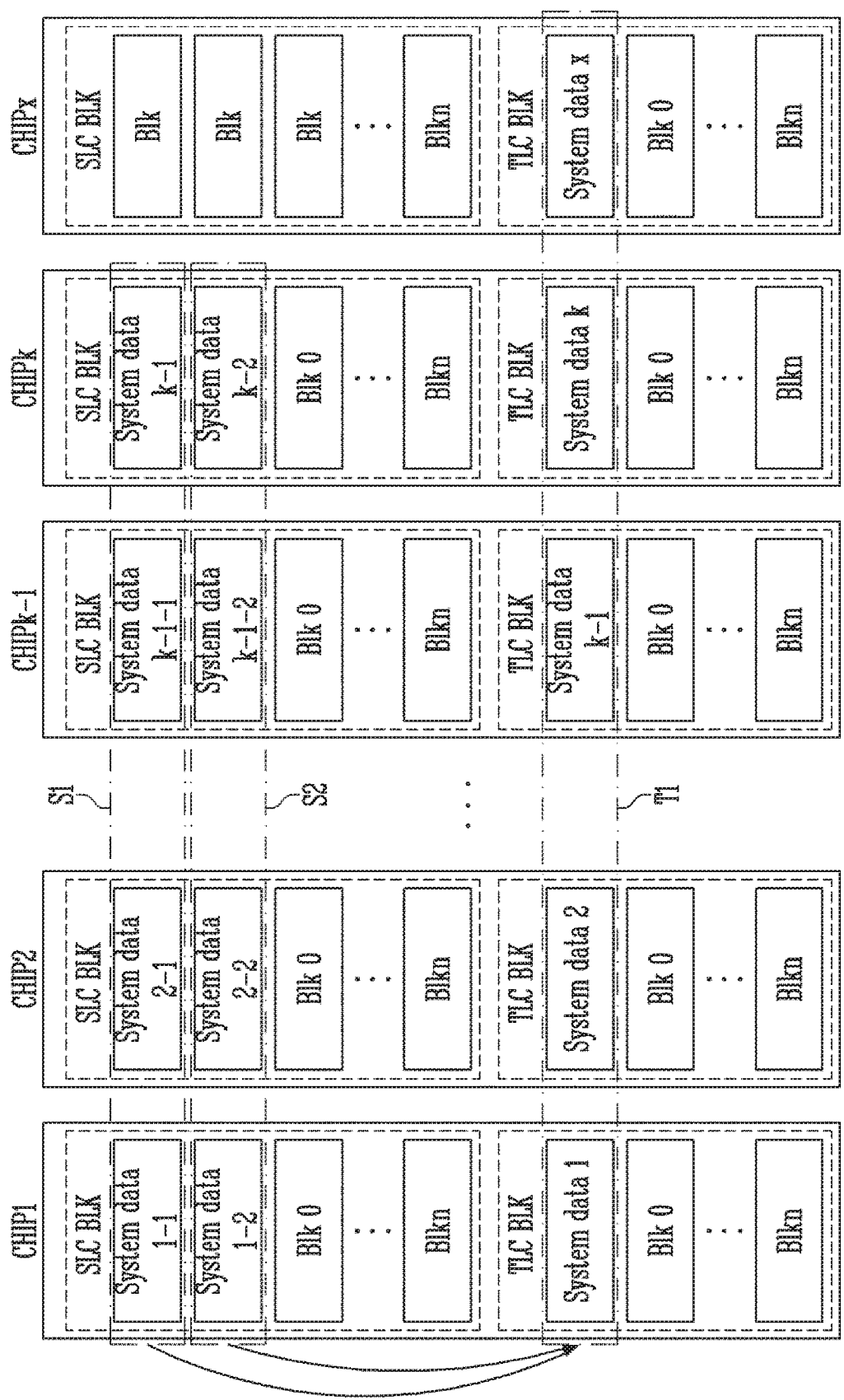
FIG. 7 is a diagram illustrating a method of storing system data, stored in SLC blocks, into TLC blocks according to an embodiment of the present disclosure.

FIG. 7 is a diagram illustrating a method of storing system data, stored in SLC blocks, into TLC blocks according to an embodiment of the present disclosure.

In FIG. 7, memory blocks included in the plurality of memory devices 100 controlled by the memory controller 200 are illustrated. In FIG. 7, a single memory device may correspond to a single memory chip.

The memory controller 200 may control first to k-th memory chips CHIP1 to CHIPk and a parity memory chip CHIPx. Each of the first to k-th memory chips CHIP1 to CHIPk and the parity memory chip CHIPx may include SLC blocks SLC BLK and TLC blocks TLC BLK. Since the system data is significant information requiring high reliability and data stability, it may be stored in the SLC blocks.

The memory blocks of the first to k-th memory chips CHIP1 to CHIPk may be operated on a super block basis. That is, as illustrated in FIG. 7, respective memory blocks included in the first to k-th memory chips CHIP1 to CHIPk may be defined as a single super block.

FIG. 7 illustrates a procedure for moving system data, stored in super block S1 and super block S2, among the SLC blocks SLC BLK of the first to k-th memory chips CHIP1 to CHIPk, to super block T1, among TLC blocks TLC BLK of the first to k-th memory chips CHIP1 to CHIPk.

The super block S1 and the super block S2, in which the system data is stored may correspond to the system area 101-3, described above with reference to FIGS. 2 to 4.

The memory controller 200 may read pieces of system data stored in the super block S1 and the super block S2, and may separate the pieces of system data into system chunks to be stored in the super block T1. Here, the memory controller 200 may generate parity system data to be stored in the parity memory chip CHIPx, as described above with reference to FIGS. 1 to 5.

The memory controller may read the system data 1-1 to system data k-1 stored in the super block S1, and the system data 1-2 to system data k-2 stored in the super block S2, and may store the pieces of system data in units of system chunks, for example system data 1 to system data k in the TLC blocks TLC BLK of the first to k-th memory chips CHIP1 to CHIPk. Here, the memory controller 200 may store parity system data (e.g., system data x), generated by performing an XOR operation on the system chunks (e.g., system data 1 to system data k), in the parity memory chip CHIPx.

The memory controller 200 may allocate the super block S1 and the super block S2, in which the pieces of system data were previously stored, to the over-provisioning area 101-4.

Figure 8:
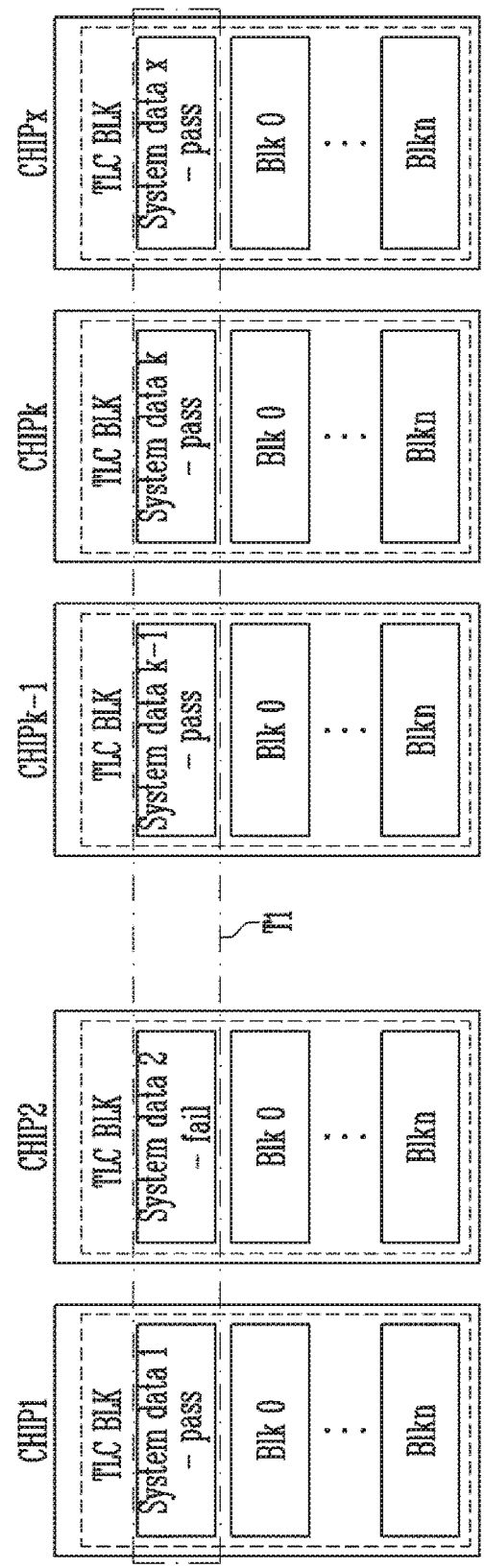
FIG. 8 is a diagram illustrating a method of recovering system data stored in a system area.

FIG. 8 is a diagram illustrating a method of recovering system data stored in the system area 101-3.

FIG. 8 illustrates a case where access to a system chuck (e.g., system data 2) stored in the second memory chip CHIP2 fails during a procedure for accessing pieces of system data stored in TLC blocks TLC BLK.

The memory controller 200 may recover the system chunk (e.g., system data 2) stored in the second memory chip CHIP2, which has failed to be accessed, by performing an XOR operation on the remaining system chunks (e.g., system data 1 and system data 3 to system data k), other than system data 2 stored in the second memory chip CHIP2, and parity system data (e.g., system data x).

In accordance with an embodiment of the present disclosure, system data stored in SLC blocks is moved to TLC blocks, and SLC blocks are allocated to an over-provisioning area, and thus sustain performance may be improved and the performance of the storage device may be enhanced.

Further, since the system data is stored in the TLC blocks, reliability may be deteriorated compared to a case where the system data is stored in SLC blocks. In this case, data recovery schemes may be secured through the configuration of RAID, as described above with reference to FIG. 8, and thus a solution to the deterioration of reliability that may occur when system data is stored in TLC blocks may be provided.

Figure 9:
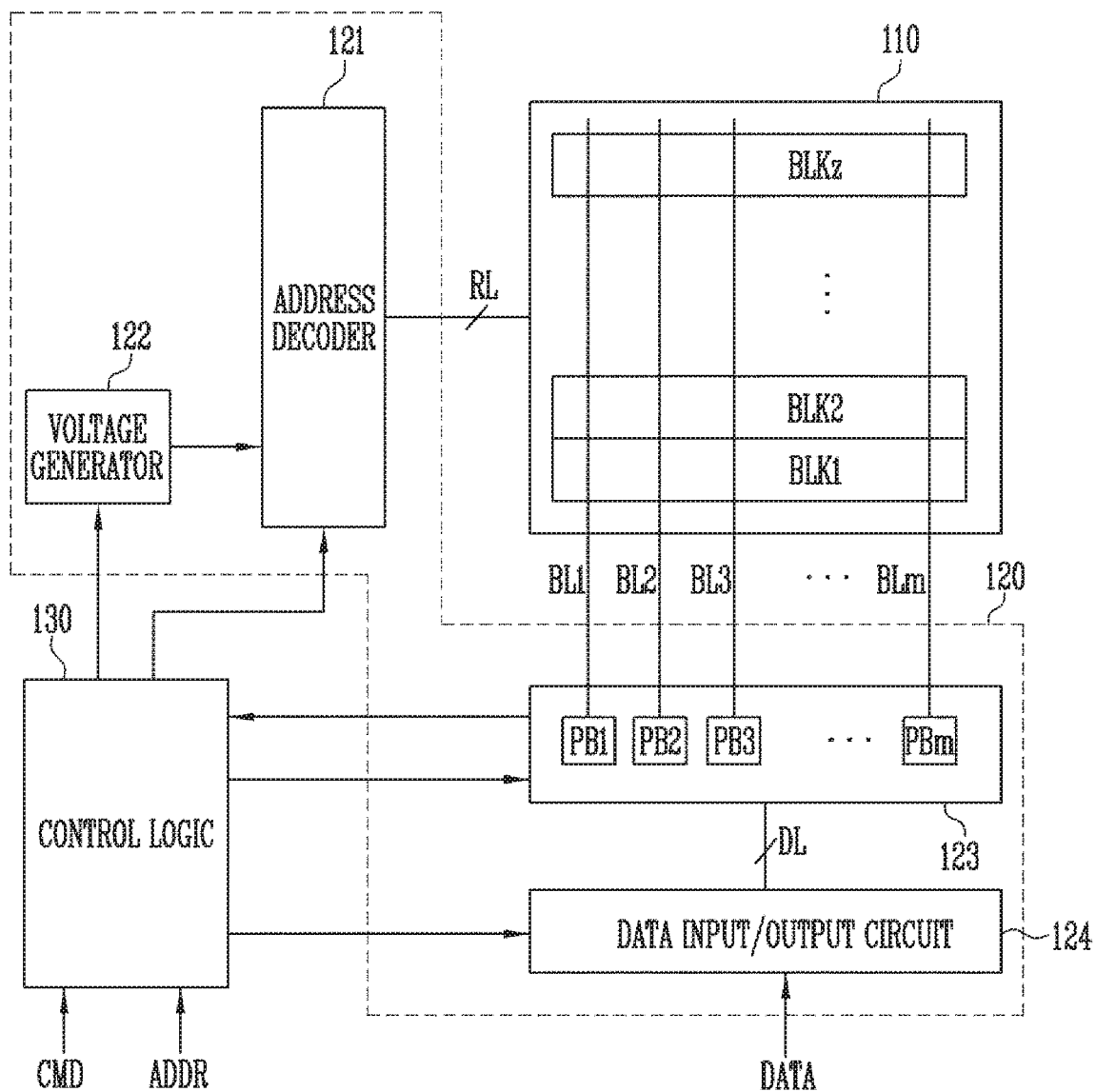
FIG. 9 is a diagram illustrating the structure of the memory device of FIG. 1.

FIG. 9 is a diagram illustrating the structure of the memory device 100 of FIG. 1.

Referring to FIG. 9, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. One or more dummy cells may be coupled in series between a drain select transistor and the memory cells and between a source select transistor and the memory cells.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives the address ADDR from the control logic 130.

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a read pass voltage higher than the read voltage to unselected word lines.

In an embodiment, the erase operation of the memory device 100 may be performed on a memory block basis. During an erase operation, the address ADDR input to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may be configured to decode a column address of the received address ADDR. A decoded column address may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage in order to generate a plurality of voltages having various voltage levels, and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data (DATA), received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers may read data, in which the threshold voltages of memory cells are stored as verify voltages, from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not shown). During a read operation, the data input/output circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 10:
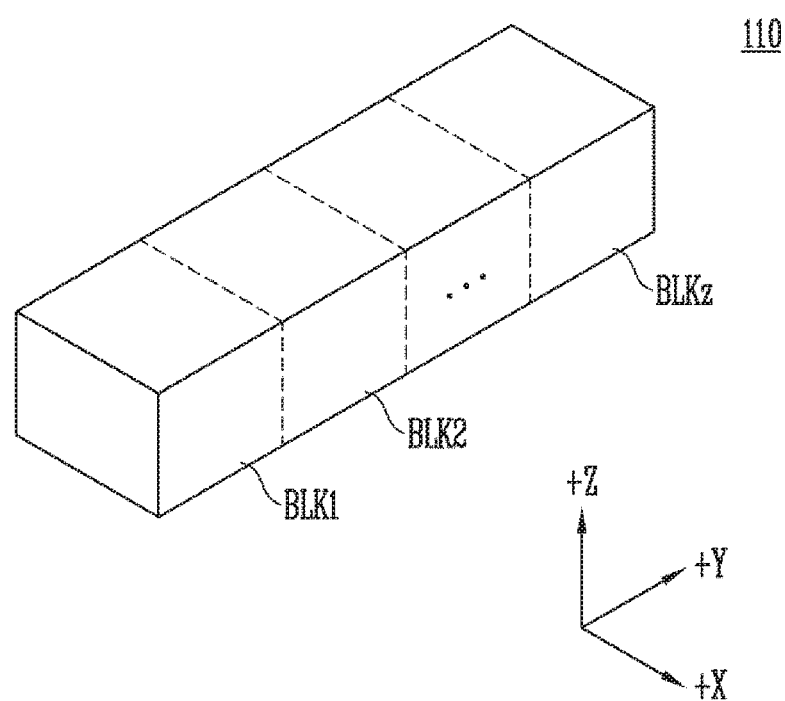
FIG. 10 is a diagram illustrating an embodiment of a memory cell array of FIG. 9.

FIG. 10 is a diagram illustrating an embodiment of the memory cell array 110 of FIG. 9.

Referring to FIG. 10, the memory cell array 110 includes a plurality of memory blocks BLK1 to BLKz. Each memory block has a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 11 and 12.

Figure 11:
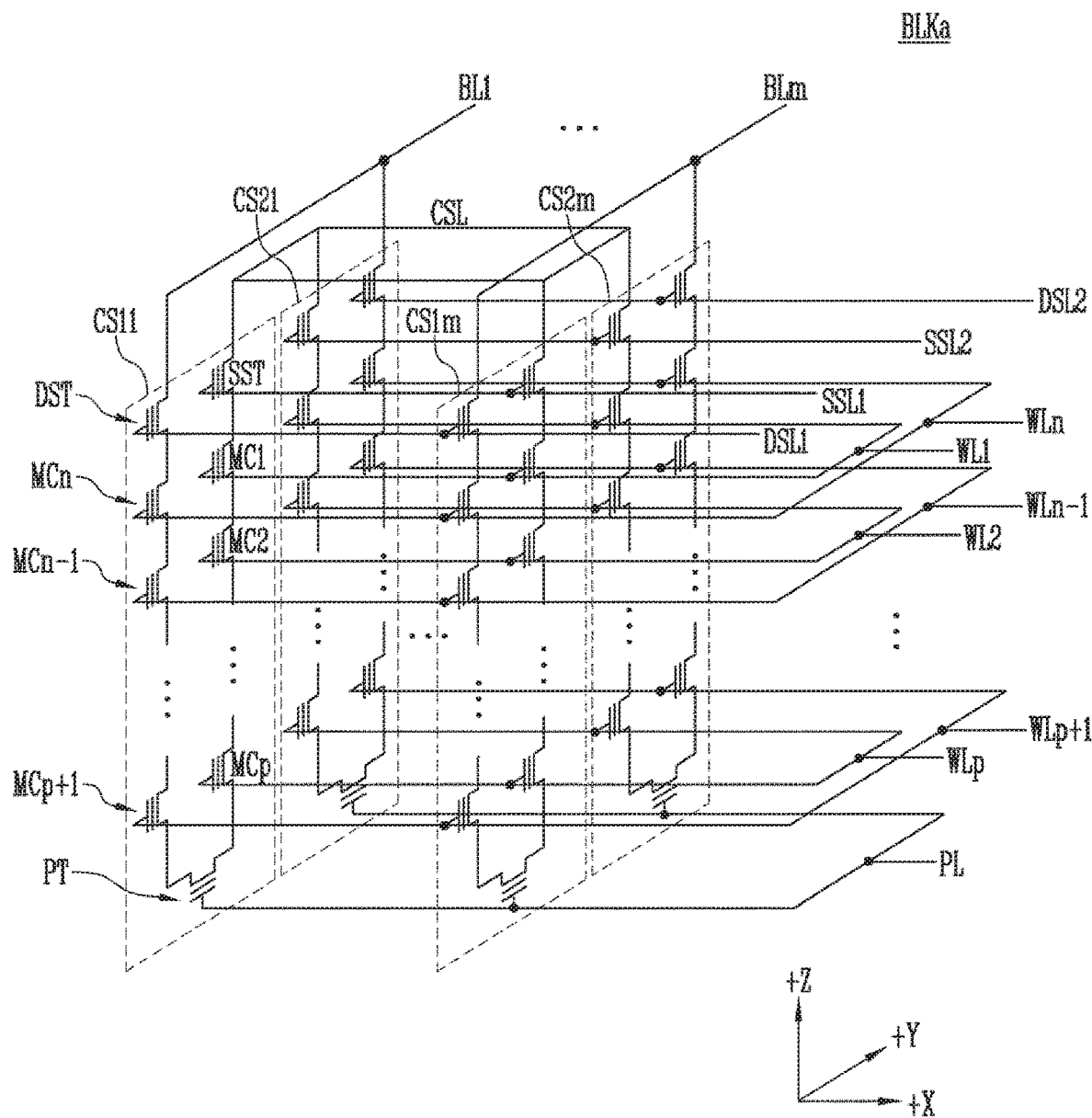
FIG. 11 is a circuit diagram illustrating any one memory block BLKa of the memory blocks BLK1 to BLKz of FIG. 10.

FIG. 11 is a circuit diagram illustrating an example of any one memory block BLKa of the memory blocks BLK1 to BLKz of FIG. 10.

Referring to FIG. 11, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 11, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 11, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extended in a column direction. In FIG. 11, cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 12:
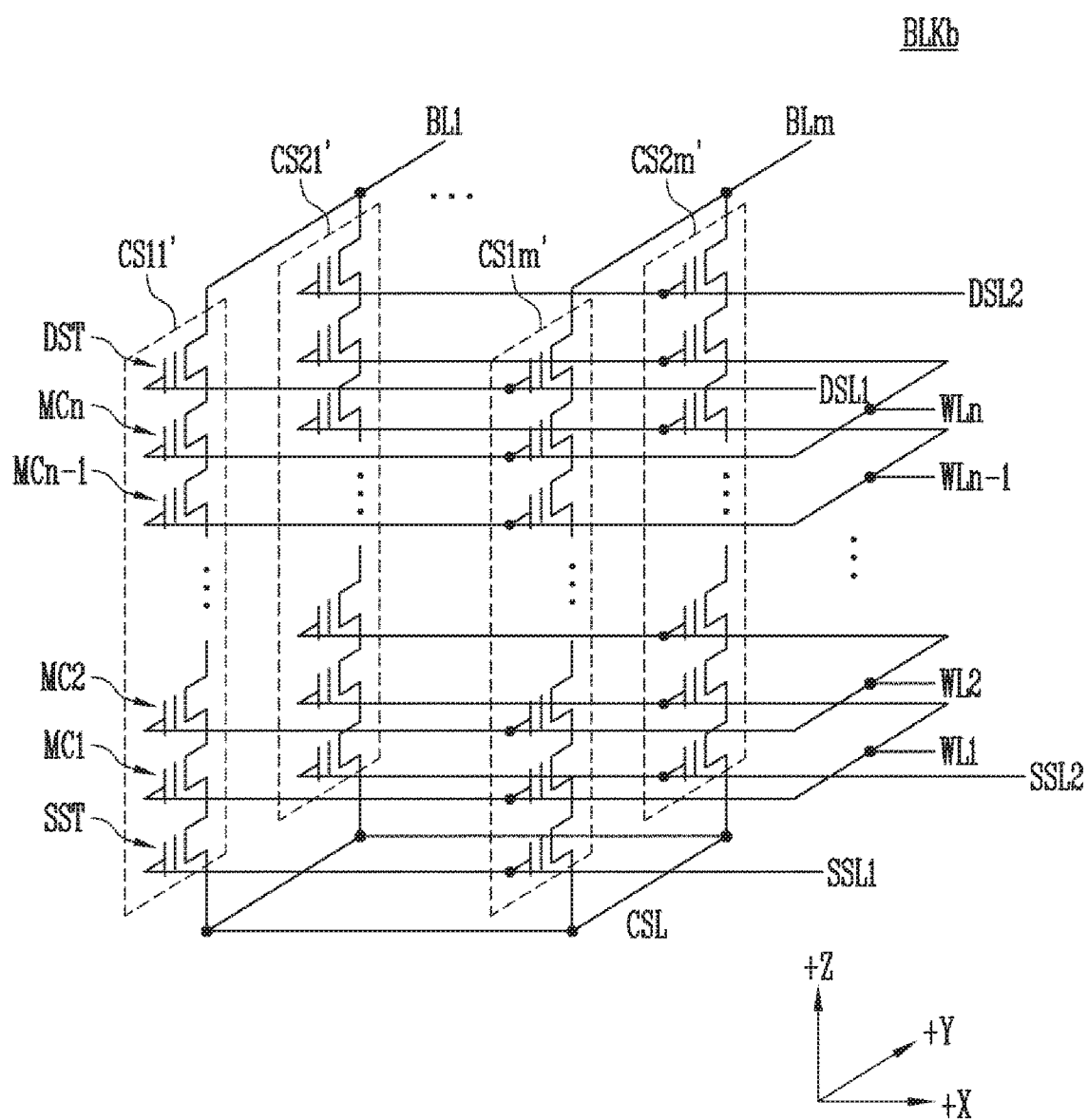
FIG. 12 is a circuit diagram illustrating an example of any one memory block BLKb of the memory blocks BLK1 to BLKz of FIG. 10.

FIG. 12 is a circuit diagram illustrating an example of any one memory block BLKb of the memory blocks BLK1 to BLKz of FIG. 10.

Referring to FIG. 12, the memory block BLKb includes a plurality of cell strings CS11' to CS1$m$' and CS21' to CS2$m$'. Each of the plurality of cell strings CS11' to CS1$m$' and CS21' to CS2$m$' is extended along a positive Z (+Z) direction. Each of the cell strings CS11' to CS1$m$' and CS21' to CS2$m$' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 12 has an equivalent circuit similar to that of the memory block BLKa of FIG. 11 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 13:
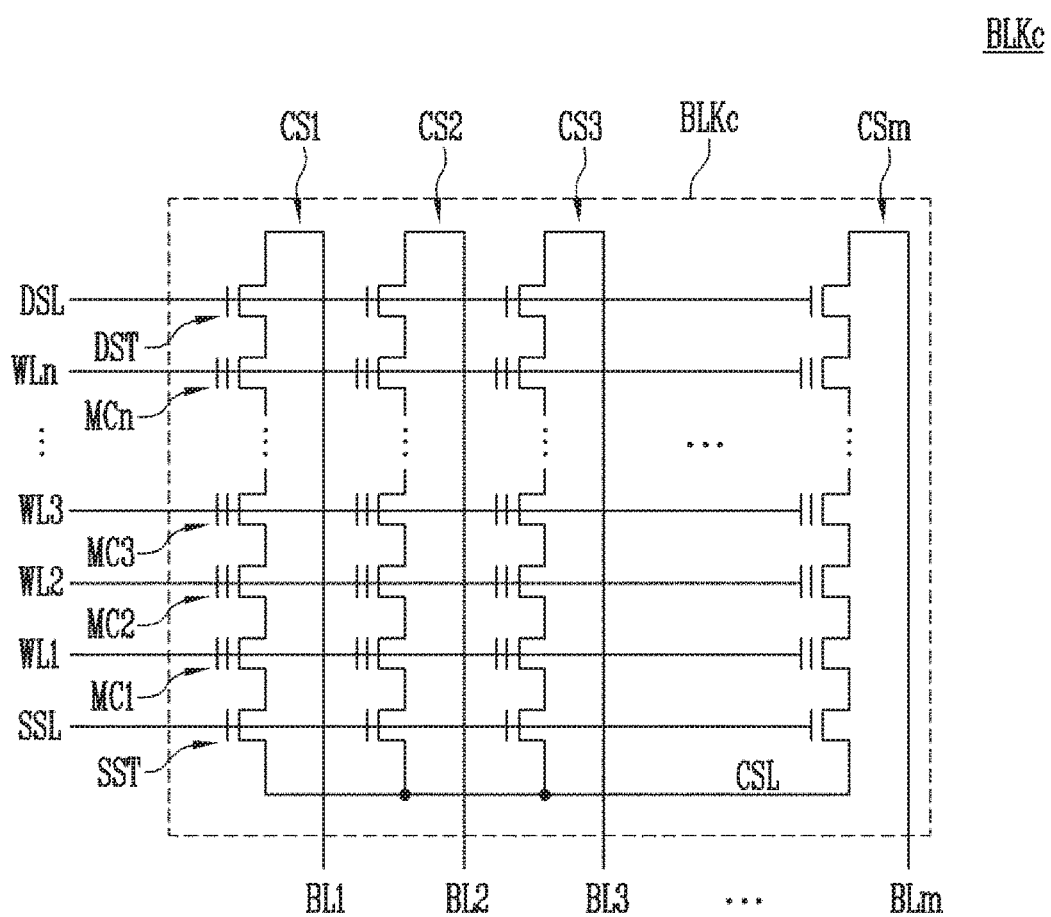
FIG. 13 is a circuit diagram illustrating an embodiment of the memory cell array of FIG. 9.

FIG. 13 is a circuit diagram showing an embodiment of the memory cell array 110 of FIG. 9.

Referring to FIG. 13, the memory cell array may have a two-dimensional (2D) planar structure, not the 3D structure described above with reference to FIGS. 10 to 12.

In FIG. 13, a memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

Figure 14:
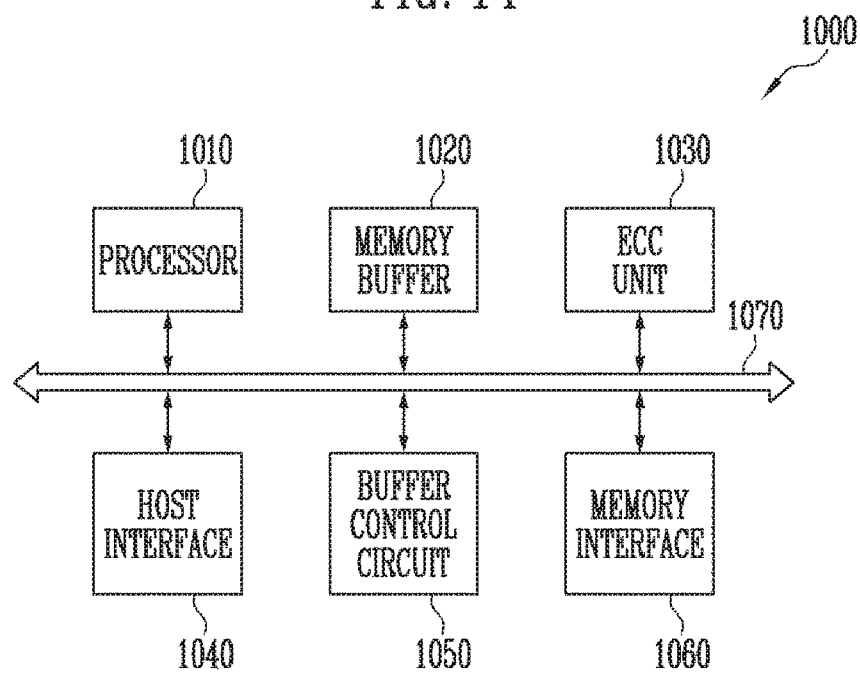
FIG. 14 is a diagram illustrating an embodiment of a memory controller of FIG. 1.

FIG. 14 is a diagram illustrating an embodiment of the memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 14, the memory controller 1000 may include a processor 1010, a memory buffer 1020, an error correction unit (error correction code: ECC) unit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be outputted to the host.

In an embodiment, the processor 1010 may run software or firmware to perform randomizing and derandomizing operations.

In an embodiment, the processor 1010 may perform the operation of the system area controller 210, described above with reference to FIGS. 1 and 5.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC unit 1030 may perform error correction. The ECC unit 1030 may perform ECC encoding based on data to be written to the memory device through the memory interface 1060. The ECC-encoded data may be transferred to the memory device through the memory interface 1060. The ECC unit 1030 may perform ECC decoding based on data received from the memory device through the memory interface 1060. In an example, the ECC unit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC unit 1030, and the memory interface 1060. The control bus may be coupled to the host interface 1040, the processor 1010, the buffer control circuit 1050, the memory buffer 1020, and the memory interface 1060.

Figure 15:
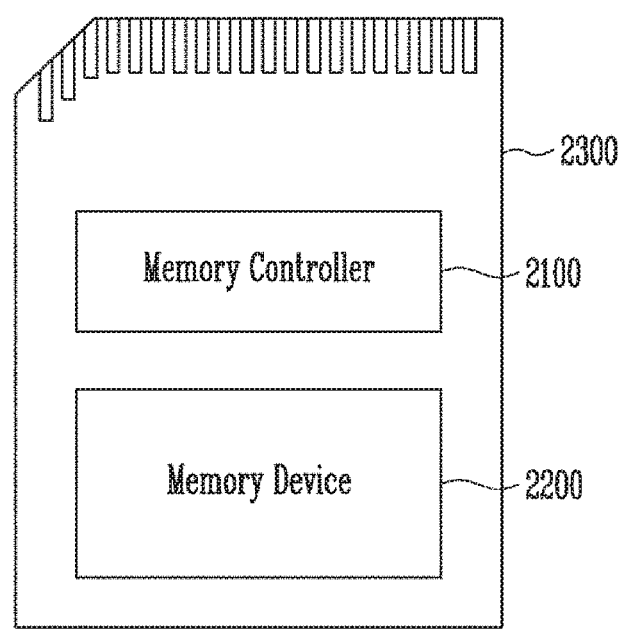
FIG. 15 is a block diagram illustrating a memory card system to which the storage device according to an embodiment of the present disclosure is applied.

FIG. 15 is a block diagram illustrating a memory card system to which the storage device according to an embodiment of the present disclosure is applied.

Referring to FIG. 15, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200, described above with reference to FIG. 1.

In an embodiment, the memory controller 2100 may include components, such as a RAM, a processor, a host interface, a memory interface, and an ECC unit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

A system area reset operation, described above with reference to FIGS. 1 to 8, may be performed by the memory controller 2100.

In an embodiment, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like, and may be provided as a single semiconductor package. Alternatively, the memory device 2200 may include a plurality of nonvolatile memory chips, which may be packaged based on the above-described package types and may be provided as a single semiconductor package.

In an embodiment, the memory controller 2100 and the memory device 2200 may be integrated into a single semiconductor device. In an embodiment, the memory controller 2100 and the memory device 2200 may be integrated into a single semiconductor device to configure a solid state drive (SSD). The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may be the memory device 100, described above with reference to FIGS. 1 and 9.

Figure 16:
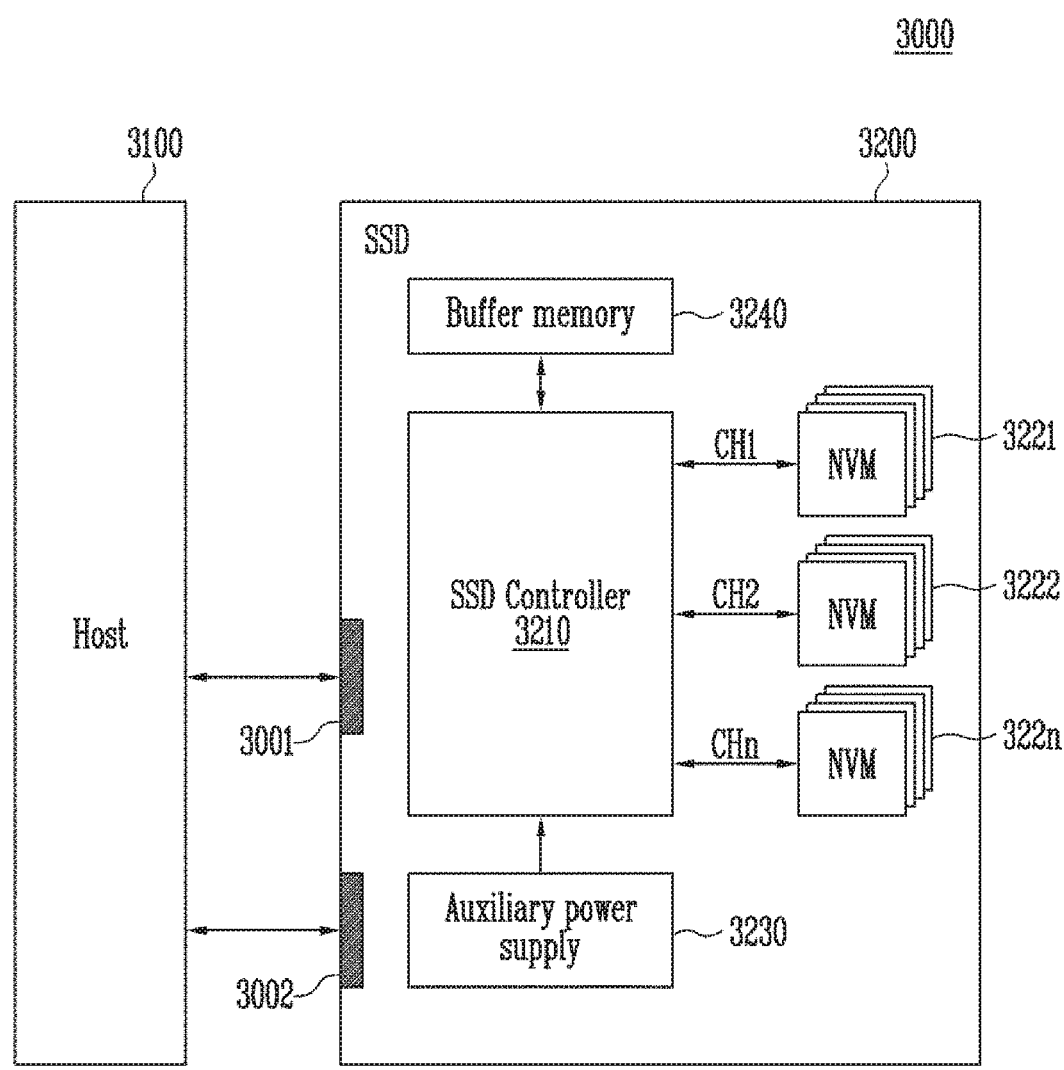
FIG. 16 is a block diagram illustrating an example of a solid state drive (SSD) system to which the storage device according to an embodiment of the present disclosure is applied.

FIG. 16 is a block diagram illustrating an example of a solid state drive (SSD) system to which the storage device according to an embodiment of the present disclosure is applied.

Referring to FIG. 16, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, each of the nonvolatile memories 3221 to 322n may be the memory device 100, described above with reference to FIGS. 1 and 9.

Figure 17:
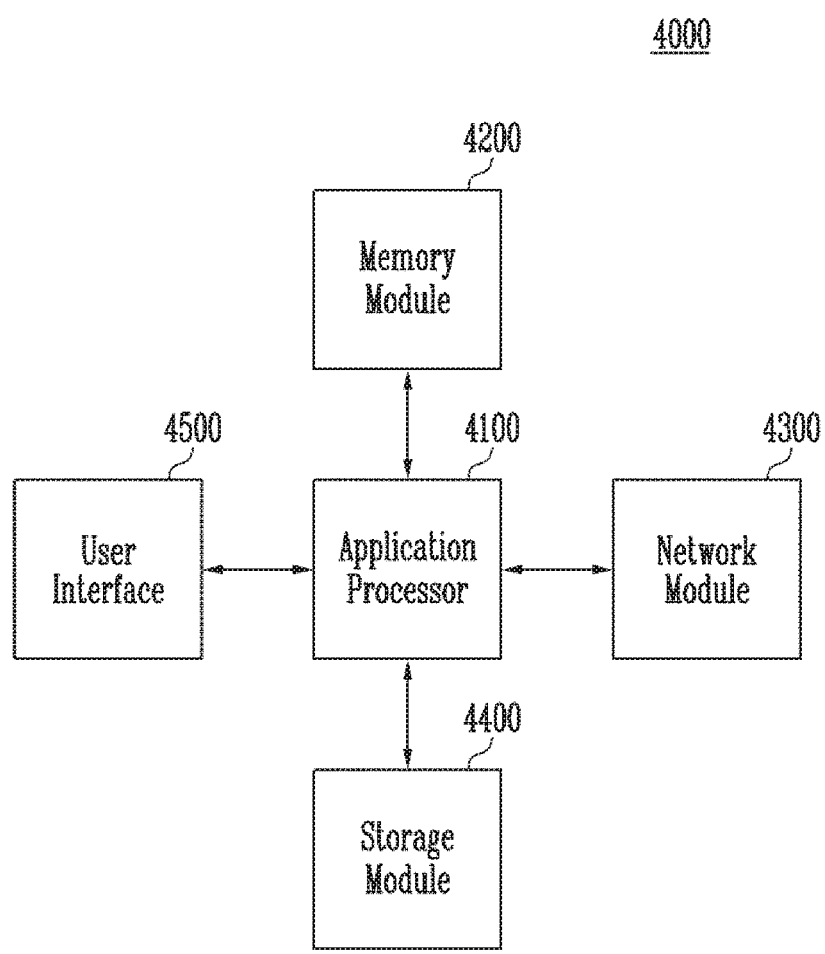
FIG. 17 is a block diagram illustrating a user system to which the storage device according to an embodiment of the present disclosure is applied.

FIG. 17 is a block diagram illustrating a user system to which the storage device according to an embodiment of the present disclosure is applied.

Referring to FIG. 17, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be the memory device 100, described above with reference to FIGS. 1 and 9.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a memory controller that controls a memory device so that an over-provisioning area is additionally secured, a storage device having the memory controller, and a method of operating the memory controller.

While exemplary embodiments of the present disclosure have been disclosed for illustrative purposes, those skilled in the art will appreciate that various modifications, additions and substitutions are possible. Therefore, the scope of the present disclosure must be defined by the accompanying claims and equivalents thereof rather than by the above-described embodiments.

Although embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure rather than to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A storage device, comprising:
at least one memory device, each including first memory blocks and second memory blocks; and
a memory controller configured to perform data migration to store system data, stored in the first memory blocks of the at least one memory device, in the second memory blocks when a size of a residual space in a memory area of the at least one memory device is less than a threshold and configured to allocate an over-provisioning area of the memory area based on a size of an extra area obtained by the data migration in a system area of the memory area.

2. The storage device according to claim 1, wherein:
the memory area is divided into a main data area in which data is stored and a system data area,
the main data area is subdivided into a used space in which data is stored and the residual space, and
the system data area is subdivided into the system area in which the system data is stored and the over-provisioning area that is a reserved space required to maintain performance of the storage space.

3. The storage device according to claim 2, wherein the memory controller comprises:
a storage space monitor configured to compare the size of the residual space with the threshold; and
a system area setting unit configured to store the system data, stored in the first memory blocks, in the second memory blocks and then secure the extra area in the system area when the size of the residual space is less than the threshold, and to allocate the over-provisioning area based on a size of the secured extra area.

4. The storage device according to claim 3, wherein the system area setting unit is configured to separate the system data, stored in the first memory blocks, into system chunks to be distributed to and stored in the second memory blocks, and to generate parity system data that is used to recover the system data using the system chunks.

5. The storage device according to claim 4, wherein the system area setting unit is configured to respectively store the system chunks and the parity system data in the second memory blocks included in the at least one memory device.

6. The storage device according to claim 4, wherein the parity system data is generated by performing an exclusive OR (XOR) operation on the system chunks.

7. The storage device according to claim 1, wherein:
the first memory blocks include memory cells to store N data bits, wherein N is a natural number, and
the second memory blocks include memory cells to store M data bits, wherein M is greater than N.

8. The storage device according to claim 1, wherein the system data is any one of map data related to mapping information between logical addresses provided from an external host and physical addresses of the at least one memory device, boot information related to information required for a boot operation of the storage device, and setting information used for an operation of firmware of the memory controller.

9. A memory controller for controlling a plurality of memory devices, each including first memory blocks and second memory blocks, the memory controller comprising:
a storage space monitor configured to compare a size of a residual space in a memory area of each of the plurality of memory devices with a threshold; and
a system area setting unit configured to perform data migration to store system data, stored in the first memory blocks, in the second memory blocks when the size of the residual space is less than the threshold and configured to allocate an over-provisioning area of the memory area based on a size of an extra area obtained by the data migration in a system area of the memory area.

10. The memory controller according to claim 9, wherein:
the memory area is divided into a main data area in which data is stored and a system data area,
the main data area is subdivided into a used space in which data is stored and the residual space, and
the system data area is subdivided into the system area in which the system data is stored and the over-provisioning area that is a reserved space required to maintain performance of the storage space.

11. The memory controller according to claim 10, wherein the system area setting unit is configured to separate the system data, stored in the first memory blocks, into system chunks to be distributed to and stored in the second memory blocks, and to generate parity system data that is used to recover the system data using the system chunks.

12. The memory controller according to claim 11, wherein the system area setting unit is configured to respectively store the system chunks and the parity system data in the second memory blocks included in the plurality of memory devices.

13. The memory controller according to claim 11, wherein the parity system data is generated by performing an exclusive OR (XOR) operation on the system chunks.

14. The memory controller according to claim 9, wherein:
the first memory blocks include memory cells to store N data bits, wherein N is a natural number, and
the second memory blocks include memory cells to store M data bits, wherein M is greater than N.

15. The memory controller according to claim 9, wherein the system data is any one of map data related to mapping information between logical addresses provided from an external host and physical addresses of the plurality of memory devices, boot information related to information required for a boot operation of the storage device, and setting information used for an operation of firmware of the memory controller.

16. A method of operating a memory controller, the memory controller controlling a plurality of memory devices, each including first memory blocks and second memory blocks, the method comprising:
determining whether a size of a residual space in a memory area of each of the plurality of memory devices is less than a threshold;
storing system data, stored in the first memory blocks, in the second memory blocks when the size of the residual space is less than the threshold; and
allocating an over-provisioning area of the memory area based on a size of an extra area, obtained by storing the system data, in a system area of the memory area.

17. The method according to claim 16, wherein storing the system data in the second memory blocks comprises:
separating the system data, stored in the first memory blocks, into system chunks to be distributed to and stored in the second memory blocks;
generating parity system data that is used to recover the system data using the system chunks; and
respectively storing the system chunks and the parity system data in the second memory blocks included in the plurality of memory devices.

18. The method according to claim 16, where determining whether the size of the residual space is less than the threshold is periodically performed whenever a preset time has elapsed, is performed at a preset point in time, or is performed whenever a write operation of writing data to the plurality of memory devices or an erase operation of erasing data, stored in the plurality of memory devices, is completed.

19. The method according to claim 16, wherein:
the first memory blocks include memory cells to store N data bits, wherein N is a natural number, and
the second memory blocks include memory cells to store M data bits, wherein M is greater than N.

20. The method according to claim 16, wherein the system data is any one of map data related to mapping information between logical addresses provided from an external host and physical addresses of the plurality of memory devices, boot information related to information required for a boot operation of the storage device, and setting information used for an operation of firmware of the memory controller.

* * * * *